(12) United States Patent
Agnew et al.

(10) Patent No.: US 12,087,574 B2
(45) Date of Patent: Sep. 10, 2024

(54) OXIDATIVE CONVERSION IN ATOMIC LAYER DEPOSITION PROCESSES

(71) Applicant: Lam Research Corporation, Fremont, CA (US)

(72) Inventors: Douglas Walter Agnew, La Jolla, CA (US); Joseph R. Abel, West Linn, OR (US); Bart Jan van Schravendijk, Palo Alto, CA (US)

(73) Assignee: Lam Research Corporation, Fremont, CA (US)

( * ) Notice: Subject to any disclaimer, the term of this patent is extended or adjusted under 35 U.S.C. 154(b) by 542 days.

(21) Appl. No.: 17/253,602

(22) PCT Filed: Jun. 27, 2019

(86) PCT No.: PCT/US2019/039621
§ 371 (c)(1),
(2) Date: Dec. 17, 2020

(87) PCT Pub. No.: WO2020/006313
PCT Pub. Date: Jan. 2, 2020

(65) Prior Publication Data
US 2021/0272801 A1  Sep. 2, 2021

Related U.S. Application Data

(60) Provisional application No. 62/962,015, filed on Jun. 29, 2018.

(51) Int. Cl.
H01L 21/02 (2006.01)
C23C 16/455 (2006.01)
H01J 37/32 (2006.01)

(52) U.S. Cl.
CPC .. *H01L 21/02274* (2013.01); *C23C 16/45536* (2013.01); *H01J 37/32082* (2013.01);
(Continued)

(58) Field of Classification Search
CPC ......... H01L 21/02274; H01L 21/02164; H01L 21/02211; H01L 21/0228; H01L 21/02315;
(Continued)

(56) References Cited

U.S. PATENT DOCUMENTS 7,906,174 B1   3/2011  Wu et al.
2007/0155137 A1  7/2007  Joshi et al.
(Continued)

FOREIGN PATENT DOCUMENTS

CN  103243310 A  8/2013
CN  104651807    5/2015
(Continued)

OTHER PUBLICATIONS

"Taiwanese Application Serial No. 108122748, Office Action mailed Dec. 19, 2022", w English Translation, 6 pgs.
(Continued)

Primary Examiner — Ratisha Mehta
(74) Attorney, Agent, or Firm — Schwegman Lundberg & Woessner, P.A.

(57) ABSTRACT

A method for processing a substrate is described. A first reactant in vapor phase is introduced into a reaction chamber having the substrate therein. The first reactant is allowed to be adsorb onto the substrate surface. The non-reactive portion of the first reactant is purged from the reaction chamber after a flow of the first reactant has ceased. The second reactant is introduced in vapor phase into the reaction chamber while the first reactant is adsorbed onto the substrate surface. The second reactant comprises a 1:1:1 ratio of dihydrogen (H2), a nitro-gen-containing reactant, and an oxygen-containing reactant. A plasma is ignited based on the second reactant. The substrate surface is
(Continued)

exposed to the plasma. The plasma is extinguished. Gas from the reaction chamber is purged.

12 Claims, 6 Drawing Sheets

(52) U.S. Cl.
CPC .. *H01J 37/32449* (2013.01); *H01J 37/32522* (2013.01); *H01J 37/32834* (2013.01); *H01L 21/02164* (2013.01); *H01L 21/02211* (2013.01); *H01L 21/0228* (2013.01); *H01L 21/02315* (2013.01); *H01L 21/0234* (2013.01); *H01J 2237/332* (2013.01); *H01J 2237/338* (2013.01)

(58) Field of Classification Search
CPC .......... C23C 16/45536; H01J 37/32082; H01J 37/32449; H01J 37/32522; H01J 37/32834
See application file for complete search history.

(56) References Cited

U.S. PATENT DOCUMENTS

| | | | |
|---|---|---|---|
| 2008/0296650 A1* | 12/2008 | Ahn | H01L 29/40114 |
| | | | 257/E29.345 |
| 2010/0055442 A1 | 3/2010 | Kellock et al. | |
| 2012/0108079 A1* | 5/2012 | Mahajani | C23C 16/45542 |
| | | | 257/E21.271 |
| 2013/0224665 A1* | 8/2013 | Wu | G03F 7/165 |
| | | | 430/324 |
| 2013/0330933 A1* | 12/2013 | Fukazawa | C23C 16/345 |
| | | | 257/E21.24 |
| 2015/0017812 A1 | 1/2015 | Chandrasekharan et al. | |
| 2017/0009346 A1* | 1/2017 | Kumar | C23C 16/45542 |

FOREIGN PATENT DOCUMENTS

| | | |
|---|---|---|
| CN | 104752199 A | 7/2015 |
| CN | 106024673 A | 10/2016 |
| CN | 112335019 | 2/2021 |
| JP | 2013072120 A | 4/2013 |
| KR | 20150037662 | 4/2015 |
| KR | 20160011149 | 1/2016 |
| TW | 201701354 | 1/2017 |
| TW | 1825114 | 12/2023 |

OTHER PUBLICATIONS

International Application Serial No. PCT/US2019/039621, International Search Report mailed Oct. 22, 2019, 5 pgs.
International Application Serial No. PCT/US2019/039621, Written Opinion mailed Oct. 22, 2019, 5 pgs.
"International Application Serial No. PCT US2019 039621, International Preliminary Report on Patentability mailed Jan. 7, 2021", 7 pages.
Taiwanese Application Serial No. 108122748, Response filed Jun. 15, 2023 to Office Action mailed Dec. 19, 2022, w/ English claims, 14 pgs.
Korean Application Serial No. 10-2021-7003022, Response filed Jan. 22, 2024 to Notice of Preliminary Rejection mailed Nov. 21, 2023, w/ English Claims, 2 pgs.
"Korean Application Serial No. 10-2021-7003022, Notice of Preliminary Rejection mailed Nov. 21, 2023", w English Translation, 18 pgs.
Chinese Application Serial No. 201980044136.3, Office Action mailed Jun. 18, 24, w/ English translation, 21 pgs.

* cited by examiner

OXIDATIVE CONVERSION IN ATOMIC LAYER DEPOSITION PROCESSES

RELATED APPLICATION

The present application is a U.S. National Stage Filing under 35 U.S.C. 371 from International Application No. PCT/US2019/039621, filed on Jun. 27, 2019, and published as WO 2020/006313 A1 on Jan. 2, 2020, which claims priority to U.S. Provisional Patent Application No. 62/692,015, filed Jun. 29, 2018, each of which is herein incorporated by reference in its entirety.

FIELD

The present disclosure relates generally to a method for reducing impurities in atomic layer deposition processes, and in particular to a modified oxidative conversion in atomic layer deposition processes.

BACKGROUND

Silicon-containing films have various physical, chemical, and mechanical properties and are often used in semiconductor fabrication processes. For example, silicon nitride films may be used as diffusion barriers, gate insulators, sidewall spacers, and encapsulation layers, and silicon oxide may be used as dielectric insulation. In various applications, silicon-containing films are deposited by chemical vapor deposition (CVD) or by atomic layer deposition (ALD). However, some deposition of silicon-containing films may be nonconformal. As device dimensions continue to shrink, there is an increasing demand to tune a deposition profile for silicon containing films over high aspect ratio topology.

DESCRIPTION OF THE DRAWINGS

Some embodiments are illustrated by way of example and not limitation in the views of the accompanying drawings.

DESCRIPTION

Figure 1:
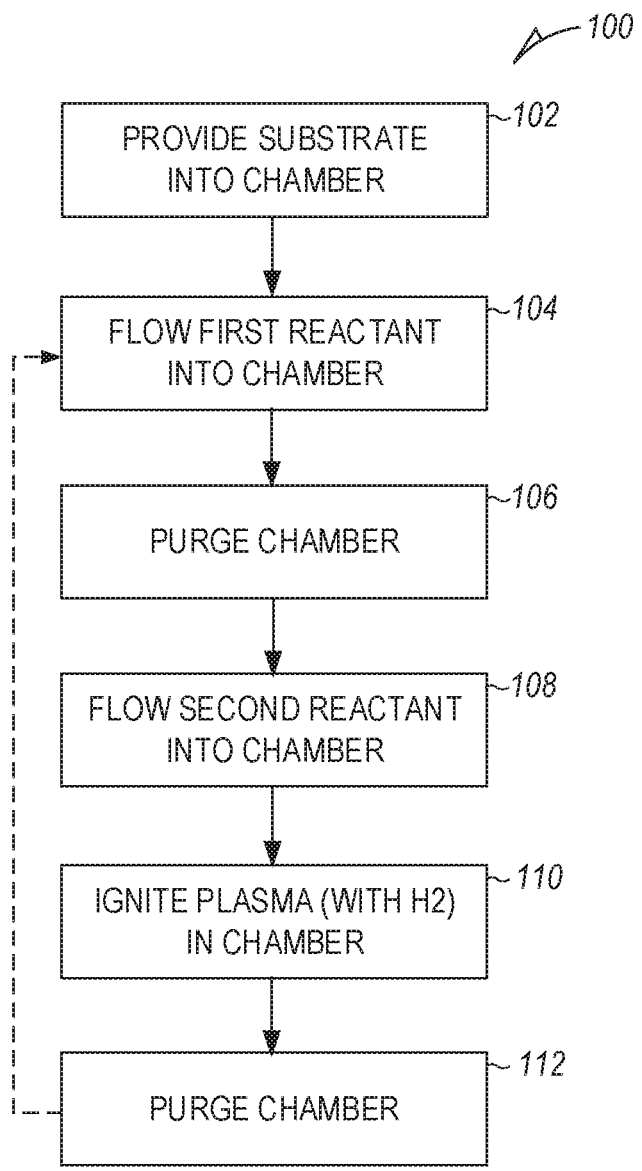
FIG. 1 is a flow diagram of a method for processing a substrate, according to an example embodiment.

The description that follows includes systems, methods, techniques, instruction sequences, and computing machine program products that embody illustrative embodiments of the present inventive subject matter. In the following description, for purposes of explanation, numerous specific details are set forth in order to provide a thorough understanding of example embodiments. It will be evident, however, to one skilled in the art, that the present embodiments may be practiced without these specific details.

A portion of the disclosure of this patent document contains material that is subject to copyright protection. The copyright owner has no objection to the facsimile reproduction by anyone of the patent document or the patent disclosure, as it appears in the Patent and Trademark Office patent files or records, but otherwise reserves all copyright rights whatsoever. The following notice applies to any data as described below and in the drawings that form a part of this document: Copyright LAM Research Corporation, 2018. All Rights Reserved.

In this application, the terms "semiconductor wafer," "wafer," "substrate." "wafer substrate." and "partially fabricated integrated circuit" are used interchangeably. One of ordinary skill in the art would understand that the term "partially fabricated integrated circuit can refer to a silicon wafer during any of many stages of integrated circuit fabrication thereon. The term "chamber" and "reactor" are also used interchangeably.

A wafer includes features such as trenches, contacts and vias that require insulation deposited in them. As the features shrink in dimension (e.g., sub-50 nm scale), or increase in aspect ratio (>5:1) depositing high quality insulating materials into them becomes more challenging. Some approaches to addressing these issues involve chemical vapor deposition (CVD), atomic layer deposition (ALD), and plasma enhanced atomic layer deposition (PEALD).

PEALD and ALD are cyclic deposition processes wherein a substrate is exposed to various chemicals in succession. The substrate is typically exposed to a first chemical or combination of chemicals to form an absorbed layer. The excess of the first chemical or chemicals is removed by pumping or purging. A second chemical or combination of chemicals is introduced to react with the first material to form a deposited material layer. The two chemicals or combinations of chemicals are selected specifically to react with one another to form the deposited material layer.

During the ALD process the tendency of the two sets of chemicals to react, typically at an elevated deposition temperature, is used to drive the formation of a film. During the PEALD process, plasma energy is used to enhance the reaction between the two sets of chemicals or to provide other desirable film characteristics. As such, PEALD has the advantage of lower process temperature, which can enable deposition over thermally unstable materials. It also lowers equipment cost and can increase process throughput. However, the PEALD process may result in poor film quality.

Current PEALD processes for the deposition of $SiO_2$ usually involve the use of either $Ar/O_2$ or $N_2O/O_2$ plasmas, or some combination thereof. These plasmas are used to affect the second main step of a PEALD $SiO_2$ cycle; namely, the production of a hydroxyl terminated surface for further reaction with a silicon containing precursor. $Ar/O_2$ plasmas are effective for producing high quality films at low temperature (due to the benefits of Ar containing plasmas such as improved plasma density and ion bombardment). As a result, this process condition is typically used for patterning applications.

However, a major drawback of Ar containing plasmas is the limited operating window with respect to RF power. Above certain wattages, plasmoids and electrical arcing in chamber are known to occur, severely curtailing the application of this process. In contrast, plasmas composed of $N_2O/O_2$ gasses are known to be more robust, allowing for higher power plasmas. Joined with this increased process window, however, is the lowered efficacy of oxidation and impurity removal.

Alternative plasma chemistries provide additional disadvantages and challenges. For example, plasma may be difficult to quickly ignite for certain gases (e.g., $O_2$). Some gas component may be expensive or difficult to obtain (e.g., $O_2$/He, $O_2$/Ne). Other chemicals provide difficulty in delivery due to their physical nature or chemical instability or reactivity (e.g., $H_2O$, $O_3$, $H_2O_2$), thereby increasing equipment cost substantially.

To address the above challenges, the present disclosure describes an alternative atomic layer deposition (ALD) process based on modified oxidation. This modified oxidation process includes introducing dihydrogen gas ($H_2$) to the plasma. Surface hydridosilane groups are converted to the corresponding hydrosiloxane terminated surface in the atomic layer deposition of $SiO_2$ of the substrate. The addition of hydrogen gas to $N_2O/O_2$ plasmas significantly improves the resulting electrical film properties, comparing to existing 400° C. films. This 200° C. drop in necessary operating temperature can result in significant cost savings.

In addition, the addition of $H_2$ to an $N_2O$ plasma results in higher density/higher quality films. The addition of $H_2$ to an $O_2$ plasma has the advantage of reducing oxidation on underlying metals, if they have reducible metal oxides. If metal oxide is already present, it can also be reduced by the addition of $H_2$.

Other benefits of using $H_2/O_2$ in a deposition/etching/deposition process or when using inhibiting chemistries as part of the PEALD process include substantially eliminating F and N in the film. Since H penetrates far into the film, one can maintain inhibition while still removing buried residual chemistry after that chemistry has served its purpose.

In some example embodiments of the present disclosure, dihydrogen ($H_2$) is added to the plasma gas composition, which consisted of 1:1 $N_2O/O_2$ mixture. The 1:1:1 mixture ($H_2$:$N_2O$:$O_2$) results in an elimination of IR bands originating from organic film impurities. Additionally, under these conditions both the breakdown field and leakage current characteristics improved compared to baseline.

Figure 4:
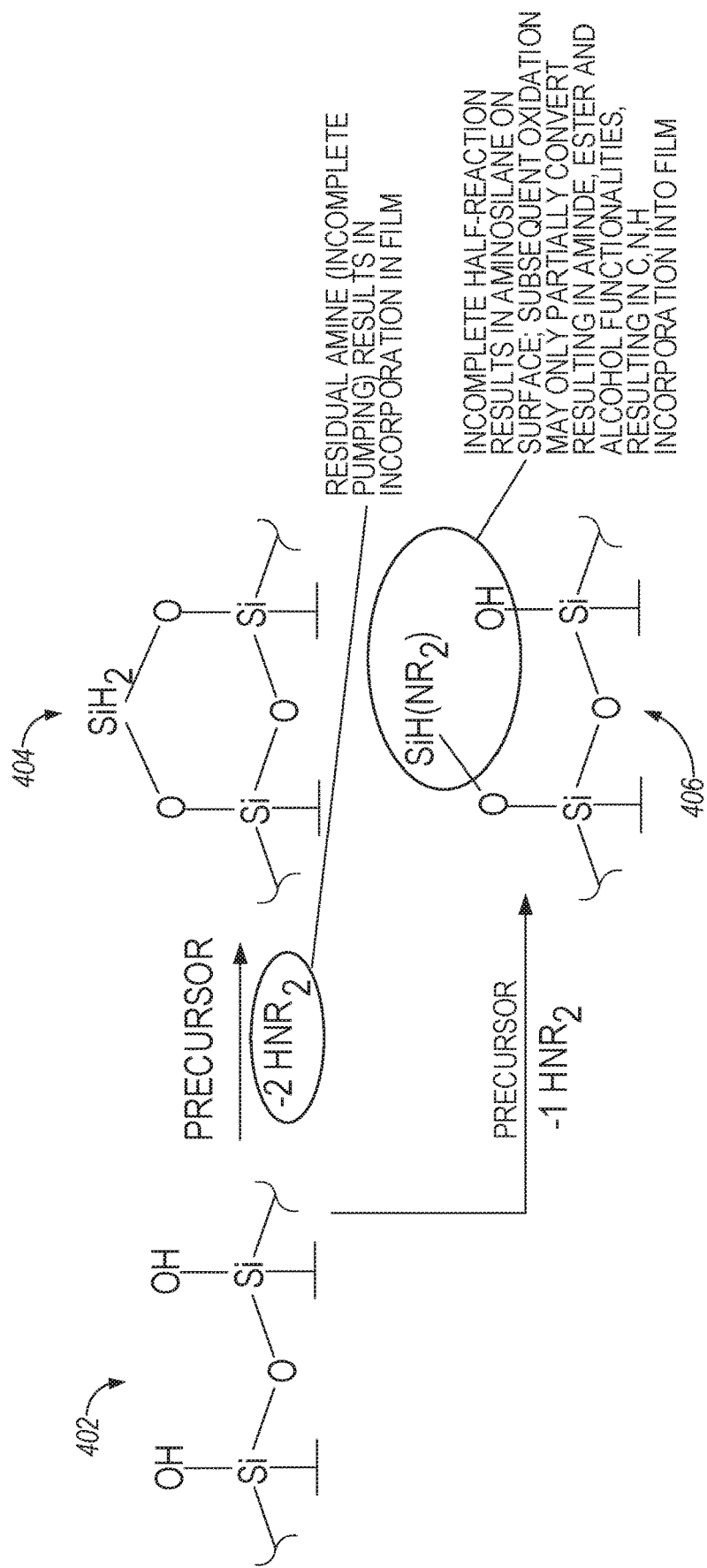
FIG. 4 is a diagram illustrating a complete and incomplete reaction, according to an example embodiment.

FIG. 1 is a flow diagram of a method for processing a substrate, according to an example embodiment. The method 100 begins at operation 102, where a substrate having recessed features is provided into a chamber. At operation 104, a dose of a first precursor (also referred to as reactant) is flowed into the chamber. The first precursor adsorbs onto the surface of the substrate, including in the recessed features. Where the film being deposited contains silicon, the first precursor is typically a silicon-containing reactant. Where the film being deposited contains a metal, the first precursor is generally a metal-containing reactant. Next, the reaction chamber is purged at operation 106. In some embodiments, the purge includes sweeping the reaction chamber with a non-reactive gas. Alternatively or in addition, the purge may include evacuating the reaction chamber by performing a pump down. In this case, the pressure in the reaction chamber is significantly lower during the pump down than during reactant delivery. The purpose of this purge operation 106 is to remove all or substantially all of the first precursor from the reaction chamber. In some embodiments, the purge/sweep may be less complete, where only a portion of the first precursor is removed from the reaction chamber. For example, FIG. 4 illustrates complete and incomplete reactions. For completed reaction, silane 402 reacts with the precursor to generate the molecular structure 404. However, incomplete reaction results in the molecular structure 406 with aminosilane on the surface to the substrate. Subsequent oxidation may only partially convert. This partial conversion results in amine, amide, carboxylic, ester, and alcohol functionalities with C, N, H incorporation into the film.

Referring back to FIG. 1, at operation 108, a second reactant is flowed into the reaction chamber. The second reactant is often a dihydrogen ($H_2$), nitrogen-containing reactant, and/or oxygen-containing reactant. Each of the first and second reactants may also be a mix of reactants. In one example, the second reactant may include a 1:1:1 ratio of dihydrogen, oxygen, and nitrous oxide. Where more than one reactant is delivered to the reaction chamber at the same time, the reactants may be mixed prior to delivery (e.g., in a separate mixing vessel), or after delivery (e.g., in the reaction chamber itself).

At operation 110, a plasma is ignited in the reaction chamber and exposed to the substrate surface. In various embodiments, operations 108 and 110 occur, at least partially, at the same time. In some cases, the second reactant may be pre-flowed into the reaction chamber at 108 before plasma ignition occurs at 110. In a particular example, the second reactant is provided continuously. In other embodiments, operations 108 and 110 begin at the same time. In alternative embodiments, the second reactant is flowed into the reaction chamber at 110, then swept/purged from the reaction chamber before pulsed plasma ignition occurs at operation 110.

Next, the plasma is extinguished and the reaction chamber is purged at operation 112. As mentioned with respect to the purge at operation 106, this may include sweeping and/or pumping down the reaction chamber. In certain cases, this sweep/purge may be optional, though the use of a post-plasma purge may help promote formation of high quality film. Operations 104-112 generally result in the deposition of a monolayer of material, though in certain embodiments, less than a monolayer of material may be deposited. These steps may be repeated a number of times in order to grow a film of the desired thickness, as indicated by the dotted arrow.

As indicated, the plasma characteristics can have a substantial effect on the deposited film. In many embodiments, the plasma is a capacitively coupled plasma (CCP). However, other types of plasma may also be used, for example inductively coupled plasmas. Various types of plasma generators may be used including RF, DC and microwave plasma generators. The plasma may be either a direct plasma (i.e., a plasma generated in the reaction chamber), or a remotely-generated plasma.

Figure 2:
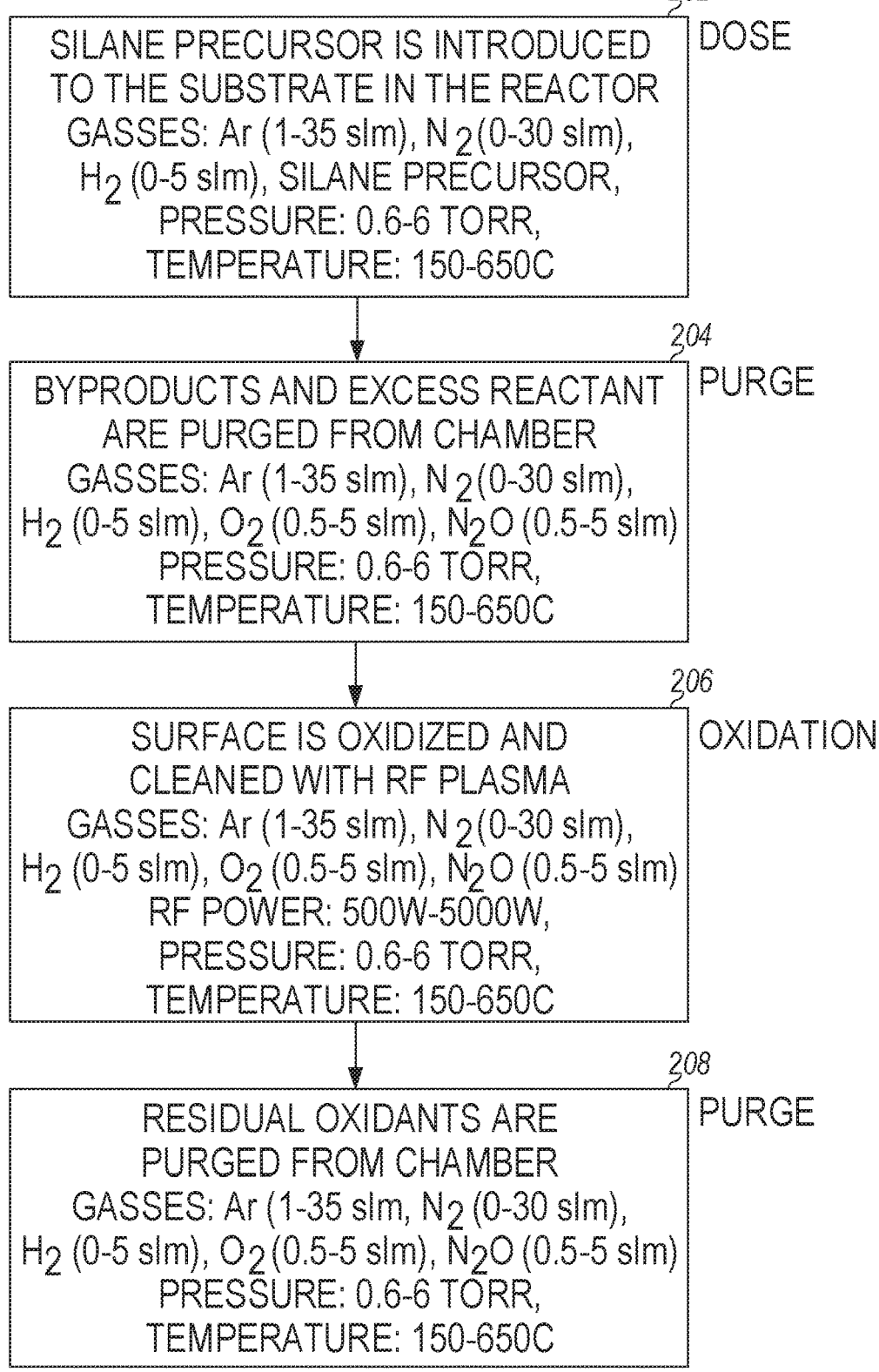
FIG. 2 is a flow diagram of a method for processing a substrate, according to another example embodiment.

FIG. 2 is a flow diagram of a method for processing a substrate, according to another example embodiment. At operation 202 (dose process), silane precursor is introduced to the substrate in the reactor. While it should be noted that when other reactors and plasma sources are used, operating conditions may vary substantially. The following is an example of a range of parameters of the dose process for a four station CCP reactor:

Gasses: Ar (1-30 slm), $N_2$ (0-30 slm), $H_2$ (0-5 slm), silane precursor,
Pressure: 0.6-6 Torr,
Temperature: 150-650° C.

At operation 204 (purge process), byproducts and excess reactant are purged from the chamber. The following is an example of a range of parameters of the purge process:

Gasses: Ar (1-30 slm), $N_2$ (0-30 slm), $H_2$ (0-5 slm), $O_2$ (0.5-15 slm), $N_2O$ (0.5-5 slm),
Pressure: 0.6-6 Torr,
Temperature: 150-650° C.

At operation 206 (oxidation process), the surface of the substrate is oxidized and cleaned with RF plasma. The following is an example of a range of parameters of the oxidation process:

Gasses: Ar (1-30 slm), $N_2$ (0-30 sim), $H_2$ (0-5 slm), $O_2$ (0.5-15 slm), $N_2O$ (0.5-5 slm),
RF power: 500 W-5000 W,
Pressure: 0.6-6 Torr,
Temperature: 150-650° C.

At operation 208 (purge process), residual oxidants are purged from the chamber. The following is an example of parameters of the purge process:

Gasses: Ar (1-30 slm), $N_2$ (0-30 slm), $H_2$ (0-5 slm), $O_2$ (0.5-15 slm), $N_2O$ (0.5-5 slm),
Pressure: 0.6-6 Torr,
Temperature: 150-650° C.

Figure 3:
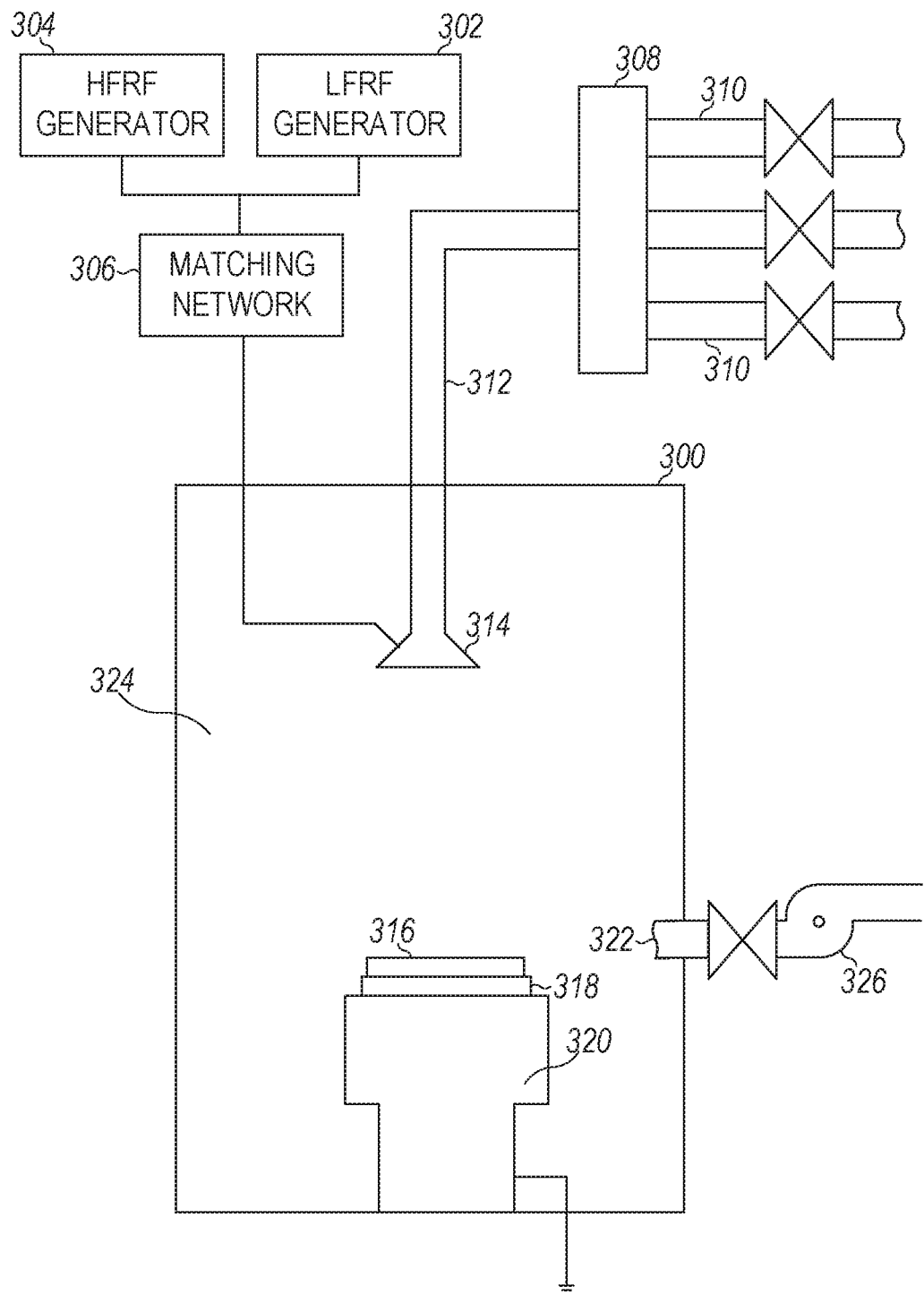
FIG. 3 is a block diagram illustrating a system for processing a substrate, according to an example embodiment.

FIG. 3 is a block diagram illustrating a system for processing a substrate, according to an example embodiment. A suitable apparatus for performing the disclosed methods typically includes hardware for accomplishing the process operations and a system controller having instructions for controlling process operations in accordance with the present invention. For example, in some embodiments, the hardware may include one or more PEALD process stations included in a process tool.

As shown, a reactor 300 includes a process chamber 324, which encloses other components of the reactor and serves to contain the plasma generated by, e.g., a capacitor type system including a showerhead 314 working in conjunction with a grounded heater block 320. A high-frequency RF generator 304, connected to a matching network 306, and a low-frequency RF generator 302 are connected to showerhead 314. These RF generators are capable of igniting a plasma as described herein. The power and frequency supplied by matching network 306 is sufficient to generate a plasma from the process gas. In one example embodiment, both the HFRF generator and the LFRF generator are used. In a typical process, the high frequency RF component is generally between about 2-60 MHz; in a preferred embodiment, the HF component is about 13.56 MHz or 27 MHz. The low frequency LF component is generally between about 0.050-2 MHz; in a particular embodiment, the LF component is about 350 kHz.

Within the reactor, a wafer pedestal 318 supports a substrate 316. The pedestal typically includes a chuck, a fork, or lift pins to hold and transfer the substrate during and between the deposition and/or plasma treatment reactions. The chuck may be an electrostatic chuck, a mechanical chuck or various other types of chuck as are available for use in the industry and/or research.

The process gases are introduced via inlet 312. Multiple source gas lines 310 are connected to manifold 308. The gases may be premixed or not. Appropriate valving and mass flow control mechanisms are employed to ensure that the correct gases are delivered during the deposition and plasma treatment phases of the process. In the case that the chemical precursor(s) are delivered in liquid form, liquid flow control mechanisms are employed. The liquid is then vaporized and mixed with other process gases during its transportation in a manifold heated above its vaporization point before reaching the deposition chamber.

Process gases exit chamber 300 via an outlet 322. A vacuum pump 326 (e.g., a one or two stage mechanical dry pump and/or a turbomolecular pump) typically draws process gases out and maintains a suitably low pressure within the reactor by a close loop controlled flow restriction device, such as a throttle valve or a pendulum valve.

Those of ordinary skills in the art will recognize that the other variations of the reactor 300 can be used to apply the presently described process. For example, the reactor 300 can include a powered pedestal instead of the showerhead 314.

Figure 5:
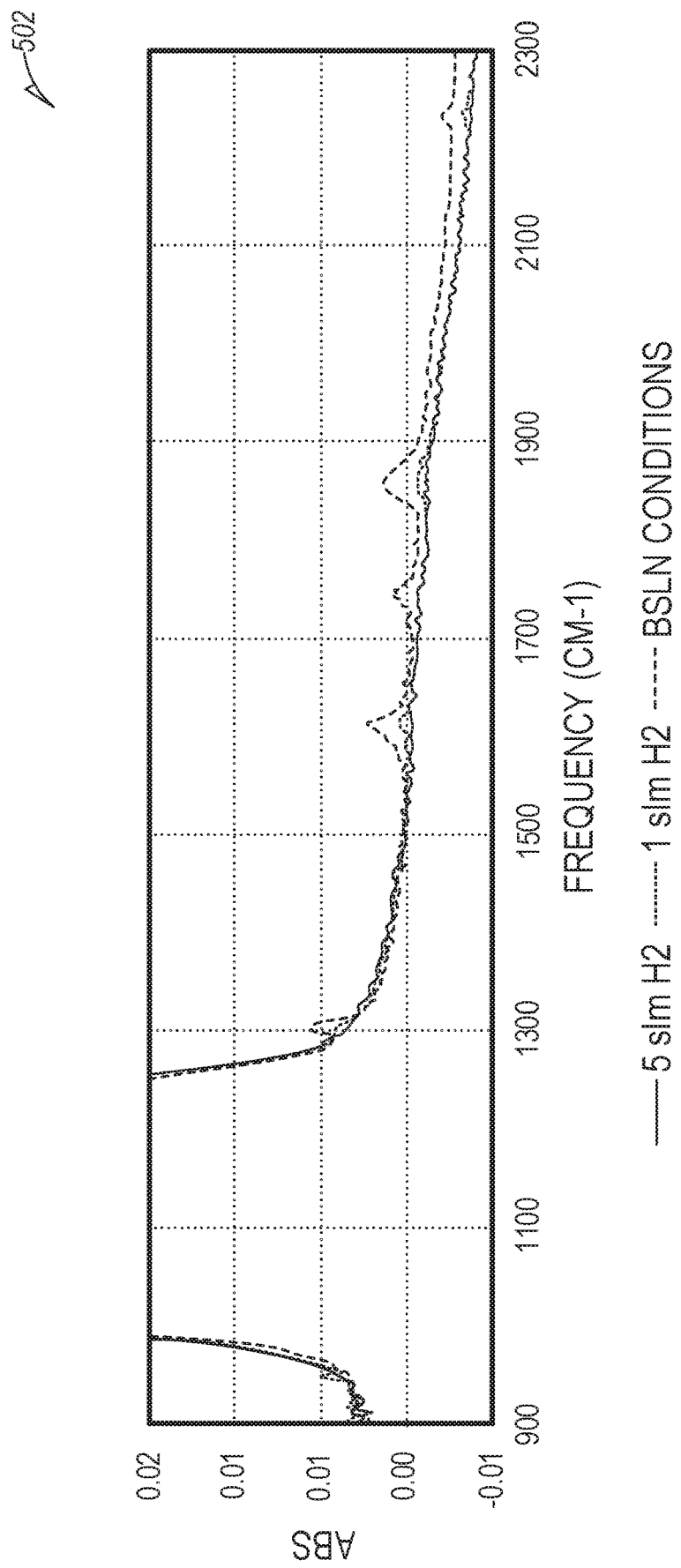
FIG. 5 is an FTIP spectrum showing the effect of the presence of $H_2$ gas in the conversion gases on the impurity content in the film, according to one example embodiment.

FIG. 5 is an FTIR spectrum showing the effect of the presence of $H_2$ gas in the conversion gases on the impurity content in the film, according to one example embodiment.

Figure 6:
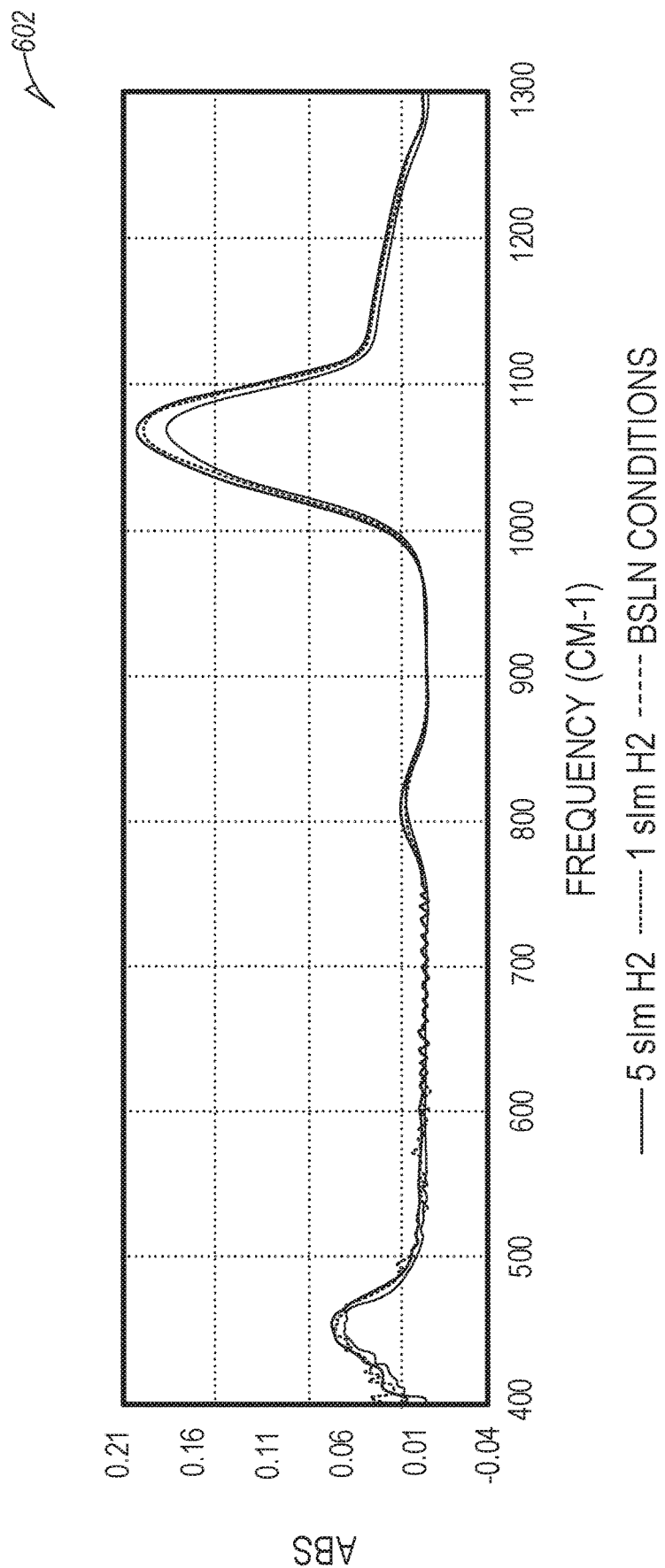
FIG. 6 is an FTIR spectrum showing the effect of the presence of $H_2$ gas in the conversion gases on the main Si—O peaks in the film, according to one example embodiment.

FIG. 6 is an FTIR spectrum showing the effect of the presence of $H_2$ gas in the conversion gases on the main Si—O peaks in the film, according to one example embodiment.

From FIGS. 5 and 6 one can see that addition of $H_2$ to the oxidative step reduces impurities in ALD $SiO_2$ with aminosilane chemistry: little or no effect on the Si—O bands is observed.

Traditional methods of achieving the above consist largely of a) increasing chamber temperature, b) increasing RF power, and c) process chemistry alteration. These three strategies all have significant shortcomings, ranging from higher CoC to process instability.

Although an embodiment has been described with reference to specific example embodiments, it will be evident that various modifications and changes may be made to these embodiments without departing from the broader scope of the disclosure. Accordingly, the specification and drawings are to be regarded in an illustrative rather than a restrictive sense. The accompanying drawings that form a part hereof show by way of illustration, and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Such embodiments of the inventive subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover all adaptations or variations of various embodiments. Combinations of the above embodiments, and other embodiments not specifically described herein, will be apparent to those of skill in the art upon reviewing the above description.

What is claimed is:

1. A method for processing a substrate for reducing impurities in an oxidative conversion process, the method comprising:
    delivering a first reactant gas into a reaction chamber having the substrate therein, a reacting portion of the first reactant gas being absorbed onto a surface of the substrate;
    purging a non-reacting portion of the first reactant gas from the reaction chamber, the non-reacting portion of the first reactant gas not being absorbed onto the surface of the substrate;

delivering a second reactant gas into the reaction chamber, the second reactant gas comprising a dihydrogen ($H_2$) gas, a nitrogen-based reactant gas, and an oxygen-based reactant gas delivered substantially concurrently into the reaction chamber, the first reactant gas and the second reactant gas being mixed prior to delivery into the reaction chamber or mixed within the reaction chamber;

igniting a plasma with the second reactant gas in the reaction chamber, the plasma being exposed to the surface of the substrate;

extinguishing the plasma; and purging the reaction chamber after the plasma is extinguished.

2. The method of claim 1, wherein the second reactant gas is composed of a mixture of $H_2$, nitrous oxide ($N_2O$), and dioxygen ($O_2$).

3. The method of claim 1, further comprising:

mixing the dihydrogen, the nitrogen-based reactant gas, and the oxygen-based reactant gas in a mixing vessel that is coupled to the reaction chamber prior to delivering the second reactant gas into the reaction chamber.

4. The method of claim 1, wherein delivering the second reactant gas further comprises: separately delivering the dihydrogen gas, the nitrogen-based reactant gas, and the oxygen-based reactant gas into the reaction chamber.

5. The method of claim 1, wherein the plasma is ignited while the second reactant gas is delivered into the reaction chamber.

6. The method of claim 1, further comprising;

applying a pressure, in the reaction chamber, from about 0.6 Torr to about 6 Torr;

heating the reaction chamber to a temperature from about 150 degrees Celsius to about 650 degrees Celsius; and applying a radio frequency (RF) power of about 500 W to about 5000 W to an RF generator that is coupled to the reaction chamber.

7. A method for processing a substrate for reducing impurities in an oxidative conversion process, the method comprising:

introducing a first reactant in vapor phase into a reaction chamber having the substrate therein, and allowing the first reactant to adsorb onto the substrate surface;

purging the reaction chamber after a flow of the first reactant has ceased;

introducing a second reactant in vapor phase into the reaction chamber while the first reactant is adsorbed onto the substrate surface, the second reactant comprising substantially a 1:1:1 ratio of dihydrogen ($H_2$), a nitrogen-containing reactant, and an oxygen-containing reactant;

igniting a plasma based on the second reactant;

exposing the substrate surface to the plasma, to drive a surface reaction between the first and second reactants on the substrate surface to form a film layer;

extinguishing the plasma; and purging the reaction chamber.

8. A system for processing a substrate to reduce impurities in an oxidative conversion process, the system comprising:

a reaction chamber having the substrate therein;

a controller configured with instructions to perform the following operations:

deliver a first reactant gas into the reaction chamber, a reacting portion of the first reactant gas being absorbed onto a surface of the substrate, and deliver a second reactant gas into the reaction chamber, the second reactant gas comprising a dihydrogen ($H_2$) gas, a nitrogen-based reactant gas, and an oxygen-based reactant gas delivered substantially concurrently into the reaction chamber, the first reactant gas and the second reactant gas being mixed prior to delivery into the reaction chamber or mixed within the reaction chamber;

a pump coupled to the reaction chamber, the pump configured to purge a non-reacting portion of the first reactant gas from the reaction chamber after the first reactant gas is delivered, the non-reacting portion of the first reactant gas not being absorbed onto the surface of the substrate; and an RF generator coupled to the reaction chamber, the RF generator configured to ignite a plasma with the second reactant gas in the reaction chamber, the plasma being exposed to the surface of the substrate.

9. The system of claim 8, wherein the second reactant gas comprises a 1:1:1 ratio of $H_2$, nitrous oxide ($N_2O$), and dioxygen ($O_2$).

10. The system of claim 8, further comprising:

a mixing vessel coupled to the reaction chamber, the mixing vessel configured to mix the dihydrogen, the nitrogen-based reactant gas, and the oxygen-based reactant gas prior to delivering the second reactant gas into the reaction chamber.

11. A method for processing a substrate for reducing impurities in an oxidative conversion process, the method comprising:

delivering a first reactant gas into a reaction chamber having the substrate therein, a reacting portion of the first reactant gas being absorbed onto a surface of the substrate;

purging a non-reacting portion of the first reactant gas from the reaction chamber, the non-reacting portion of the first reactant gas not being absorbed onto the surface of the substrate;

delivering a second reactant gas into the reaction chamber, the second reactant gas comprising a mixture of dihydrogen ($H_2$), nitrous oxide ($N_2O$), and dioxygen ($O_2$) delivered substantially concurrently into the reaction chamber, the first reactant gas and the second reactant gas can be mixed prior to delivery into the reaction chamber or mixed within the reaction chamber;

igniting a plasma with the second reactant gas in the reaction chamber, the plasma being exposed to the surface of the substrate;

extinguishing the plasma; and purging the reaction chamber after the plasma is extinguished.

12. The method of claim 11, wherein the second reactant gas comprises a substantially 1:1:1 ratio of $H_2$, $N_2O$, and $O_2$.

* * * * *